(12) United States Patent
Yasukawa

(10) Patent No.: US 10,276,249 B2
(45) Date of Patent: Apr. 30, 2019

(54) STORAGE CONTROL DEVICE, INFORMATION PROCESSING METHOD, AND STORAGE MEDIUM

(71) Applicant: CANON KABUSHIKI KAISHA, Tokyo (JP)

(72) Inventor: Takuma Yasukawa, Kashiwa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/594,212

(22) Filed: May 12, 2017

(65) Prior Publication Data
US 2017/0337977 A1 Nov. 23, 2017

(30) Foreign Application Priority Data

May 19, 2016 (JP) .................. 2016-100796

(51) Int. Cl.
| G11C 16/34 | (2006.01) |
| G11C 11/56 | (2006.01) |
| G11C 16/04 | (2006.01) |
| G11C 29/44 | (2006.01) |

(52) U.S. Cl.
CPC ...... *G11C 16/3418* (2013.01); *G11C 11/5628* (2013.01); *G11C 16/3459* (2013.01); *G11C 16/0483* (2013.01); *G11C 2029/4402* (2013.01); *G11C 2211/5641* (2013.01)

(58) Field of Classification Search
CPC ............ G11C 16/3418; G11C 16/3459; G11C 11/417; G11C 29/52; G06F 11/1072
USPC ..................................................... 365/185.03
See application file for complete search history.

(56) References Cited

U.S. PATENT DOCUMENTS

| 2009/0172267 A1* | 7/2009 | Oribe ................. G11C 16/3418 711/103 |
| 2012/0297122 A1* | 11/2012 | Gorobets ............ G06F 12/0246 711/103 |
| 2016/0188464 A1* | 6/2016 | Bar-Or ................ G06F 12/0638 711/103 |
| 2016/0364175 A1* | 12/2016 | Yang ..................... G06F 3/0616 |
| 2017/0060463 A1* | 3/2017 | Shim ..................... G06F 3/0625 |
| 2017/0185137 A1* | 6/2017 | Oh ........................ G06F 1/3287 |

FOREIGN PATENT DOCUMENTS

JP          2015-148859 A          8/2015

* cited by examiner

*Primary Examiner* — Fernando N Hidalgo
(74) *Attorney, Agent, or Firm* — Canon U.S.A., Inc. IP Division

(57) ABSTRACT

A storage control device includes a determination unit configured to determine whether each area in a nonvolatile storage is set to be in a partition corresponding to a Multi Level Cell (MLC) mode or to be in a partition corresponding to a Single Level Cell (SLC) mode and a control unit configured to perform data refreshing at a higher frequency on an area determined to be set to be in the partition corresponding to the MLC mode than on an area determined to be set to be in the partition corresponding to the SLC mode.

20 Claims, 7 Drawing Sheets

FIG. 5

| AREA ID | AREA NAME | SET PARTITION | |
|---|---|---|---|
| 0 | FIRMWARE AREA | MLC | ~501 |
| 1 | LANGUAGE DATA AREA | MLC | ~502 |
| 2 | JOB DATA AREA | SLC | ~503 |
| | | | |

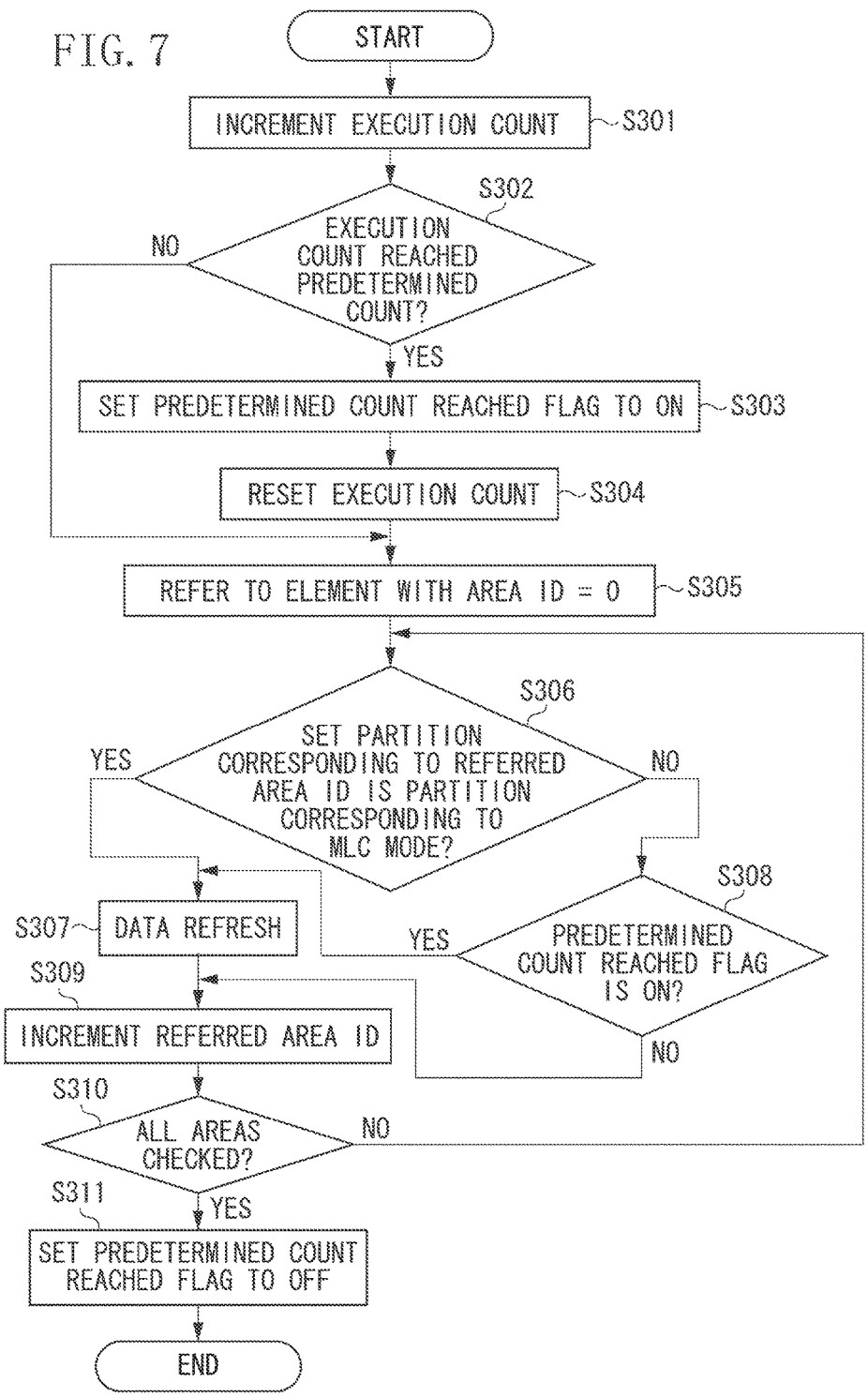

STORAGE CONTROL DEVICE, INFORMATION PROCESSING METHOD, AND STORAGE MEDIUM

BACKGROUND OF THE INVENTION

Field of the Invention

The aspect of the embodiments relates to a storage device, an information processing method, and a storage medium.

Description of the Related Art

Recently, devices using an embedded Multi Media Card (eMMC) as a main storage have increased. A NAND flash memory forming the eMMC, in which information is represented by a charge amount in a cell as a minimum storage unit, is roughly classified into different types in accordance with how charges are included. A Single Level Cell (SLC) can store information of 1 bit in a single cell, whereas a Multi Level Cell (MLC) can store information of 2 bits or more in a single cell. Thus, compared with the SLC, the MLC can store a larger amount of information but degrades faster because information based on the amount of charges is required to be accurately determined. For this reason, the MLC has a smaller number of rewritable times, and a shorter data retention period, which is about 10% of that of the SLC. By contrast, compared with the MLC with the same capacity, the SLC can store a smaller amount of information, and is less likely to degrade. Thus, the SLC features a comparatively larger number of rewritable times and a longer data retention period, and is less likely to lose data. In view of the foregoing, some eMMCs have a function of being usable while being divided into one partition corresponding to an MLC mode and another partition to an SLC mode. With this function, each area can be set to be used in the SLC mode or the MLC mode in accordance with how the area is used.

In one method for determining whether data stored in a NAND flash memory is correct and making correction (refreshing), the correction is made with an error correction code (ECC) in a redundant area provided separately from the data. For example, the reliability of the data can be guaranteed by refreshing the entire area of the eMMC once every several months.

This method relies on collective and uniform data refreshing, regardless of whether the partition storing the data corresponds to the MLC (mode) or the SLC (mode) (see Japanese Patent Application Laid-Open No. 2015-148859).

SUMMARY OF THE INVENTION

According to an aspect of the embodiments, a storage control device includes a determination unit configured to determine whether each area in a nonvolatile storage is set to be in a partition corresponding to a Multi Level Cell (MLC) mode or to be in a partition corresponding to a Single Level Cell (SLC) mode and a control unit configured to perform data refreshing at a higher frequency on an area determined to be set to be in the partition corresponding to the MLC mode than on an area determined to be set to be in the partition corresponding to the SLC mode.

Further features of the present invention will become apparent from the following description of exemplary embodiments with reference to the attached drawings.

BRIEF DESCRIPTION OF THE DRAWINGS

FIG. 5 is a diagram illustrating an example of an area setting table recorded in a static random access memory (SRAM).

FIG. 7 is a flowchart illustrating an example of information processing according to the exemplary embodiment.

DESCRIPTION OF THE EMBODIMENTS

Various devices recently available include a multi-functional peripheral (MFP) having functions of a copier, a printer, a scanner, and the like and a single functional peripheral (SFP) having a single function. Among these, devices targeted toward small offices and general users have been especially requested to be downsized. Thus, devices employing an embedded Multi Media Card (eMMC) serving as a storage have been increasing. Some MFPs or SFPs, implementing a certain function, may use a storage divided into a plurality of areas. For example, the storage may be divided into an area storing firmware, a data area for managing job information or image information, and an area storing a plurality of types of language data so that a display language can be switched. The eMMC may be divided into partitions corresponding to a Multi Level Cell (MLC) mode and a Single Level Cell (SLC) mode, to achieve more than a simple storage of data in each of the partitions. In this configuration, in accordance with a type of data, the data can be determined to be managed in which one of the partitions. More specifically, a data area involving frequent rewriting is set to be in a partition corresponding to the SLC mode (SLC partition) with a higher durability. On the other hand, firmware programs as well as language data and the like may require a relatively large capacity and including infrequently used data may be set to be in a partition corresponding to the MLC mode (MLC partition), so that the capacity can be more efficiently used.

The collective and uniform data refreshing, as described above in "Description of the Related Art", on the partitions corresponding to the SLC mode and the MLC mode with different data retention performances would not be performed at a frequency appropriate for both of the partitions. In other words, the frequency of the data refreshing suitable for the MLC mode having a lower data retention performance would be excessive for the SLC partition, resulting in a higher risk of overlapping between the refreshing and data access by a user for executing a job, which compromises the job performance. The frequency of the data refreshing suitable for the SLC mode having a higher data retention performance would be insufficient for the MLC partition, resulting in a higher risk of losing data. In an exemplary embodiment of the disclosure, data refreshing is performed at an appropriate frequency in a nonvolatile memory that can be divided into partitions corresponding to the MLC mode and the SLC mode.

An exemplary embodiment of the disclosure is described with reference to the drawings.

Figure 1:
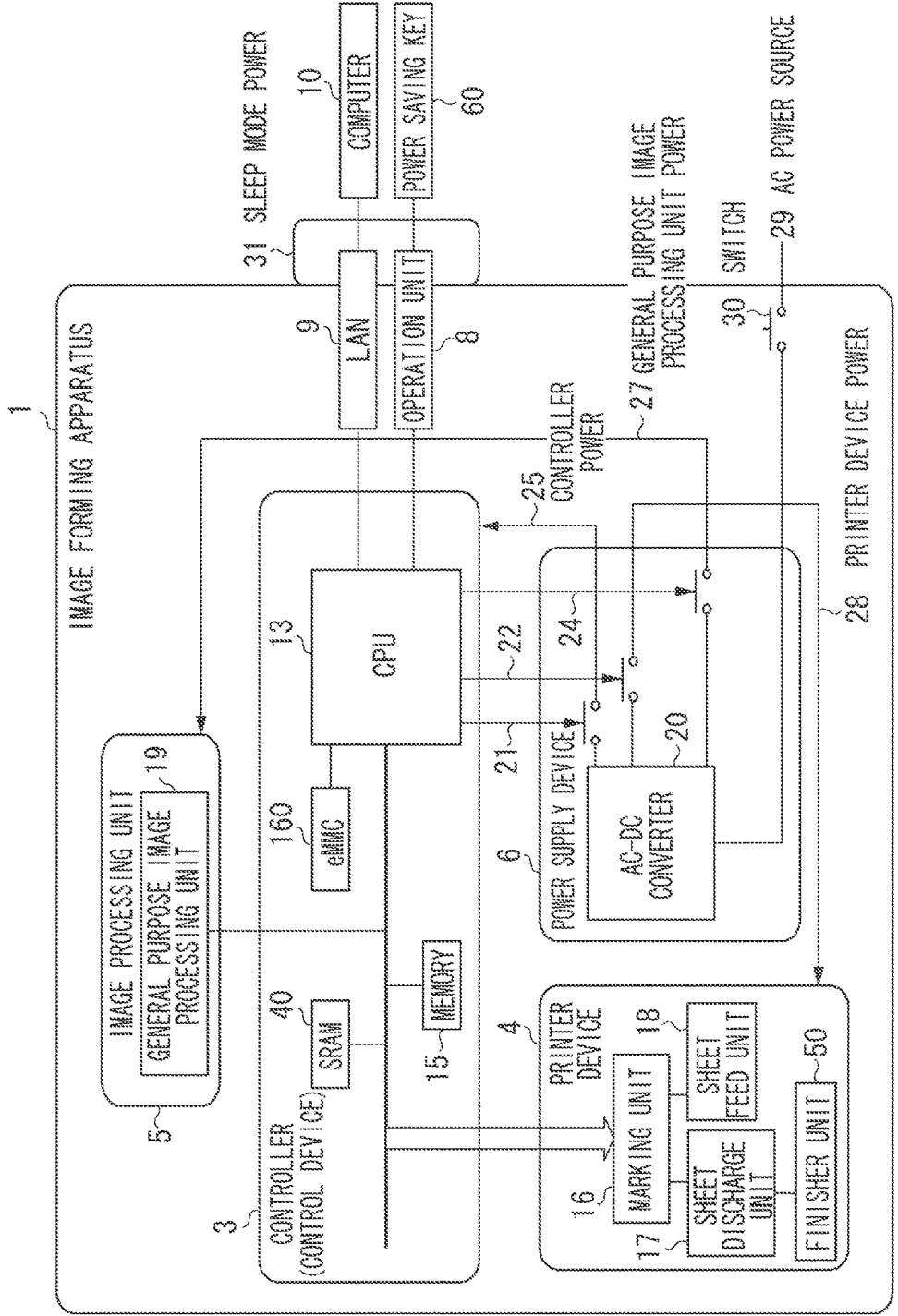
FIG. 1 is a diagram illustrating an example of a hardware configuration of an image forming apparatus.

FIG. 1 is a diagram illustrating an example of a hardware configuration of an image forming apparatus 1.

The image forming apparatus 1 includes components described below. The image forming apparatus 1 is an example of a storage control device.

A printer device 4 is an engine for outputting a digital image to a sheet device. An operation unit 8 is used for performing an operation on the apparatus and for displaying. An embedded Multi Media Card (eMMC) 160 stores a user setting value and a device setting value, as well as the digital image. A controller 3 is connected to these modules, and issues an instruction to each module, so that a job can be executed on the image forming apparatus 1. The image forming apparatus 1 can input/output the digital image from/to a computer 10 via a local area network (LAN) 9, issue a job and issue an instruction to devices. The printer device 4 includes a sheet feed unit 18, a marking unit 16, a sheet discharge unit 17, and a finisher unit 50. The sheet feed unit 18 can feed sheets one by one as appropriate. The marking unit 16 is used for printing image data on a sheet thus fed. The sheet discharge unit 17 is used for discharging a printed sheet. The finisher unit 50 is used for executing post-processing on a discharged sheet. The controller 3, including a central processing unit (CPU) 13, transmits and receives image data to and from the printer device 4 and stores the image data. More specifically, the controller 3 temporarily stores image data, which has been received through the LAN 9, in a memory 15, and then stores the image data in the eMMC 160 to complete the storing. The controller 3 can perform print output by temporarily storing the image data from the eMMC 160 in the memory 15, and then transmitting the image data from the memory 15 to the printer device 4. An image processing unit 5 includes a general purpose image processing unit 19. The general purpose image processing unit 19 executes processing, such as reduction for example, on image data stored in the memory 15, and can store the resultant image data again in the memory 15. The image forming apparatus 1 includes the operation unit 8 controlled by the controller 3, and can execute various jobs with the CPU 13 interpreting an operation made by an operator or an instruction received through the LAN 9. The operation unit 8 can display a state of a job and an engine state of the printer device 4. The eMMC 160 stores programs and various types of data. A static random access memory (SRAM) 40 is a nonvolatile memory for storing setting information and the like may be required for operating the image forming apparatus 1, and holds the information even when a power supply is turned OFF. For example, the SRAM 40 further stores a table for determining whether each of areas such as a data area, a firmware area, and a language data area, generated in the eMMC 160 is to be used in the SLC mode or the MLC mode. These pieces of information may be stored in a certain area of the eMMC 160, which is one example of a nonvolatile storage.

A power supply device 6 supplies power in the image forming apparatus 1. When the image forming apparatus 1 is OFF, an alternate current (AC) power source 29 is cut off by a switch 30. When the switch 30 is turned ON, direct current (DC) power is generated with the AC power supplied to an AC-DC converter 20. The image forming apparatus 1 can be divided into four sections that can be controlled independently from each other in terms of power supply, through an instruction from the CPU 13. More specifically, the CPU 13 can use a switch unit 21 to perform control in such a manner that controller power 25 is turned ON/OFF. Similarly, a switch unit 22 and a switch unit 24 can be respectively used for controlling ON/OFF of printer device power 28 and general purpose image processing unit power 27. The CPU 13 selectively supplies power to required sections of the image forming apparatus 1 using the switch units 21, 22, and 24.

Functions of the image forming apparatus 1 and processing in flowcharts in FIGS. 4, 6, and 7, described below, are implemented with the CPU 13 executing processing based on a program stored in the eMMC 160 and the like.

Figure 2:
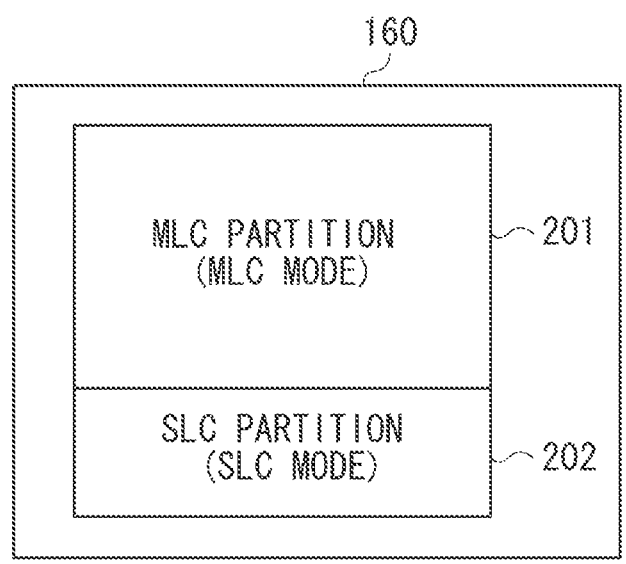
FIG. 2 is a diagram illustrating an example of mode setting for an embedded Multi Media Card (eMMC).

FIG. 2 is a diagram illustrating an example of mode setting of the eMMC 160. When the MLC mode and the SLC mode can be set, the eMMC 160 can be divided into an MLC partition (MLC mode) 201 and an SLC partition (SLC mode) 202 to be used.

Figure 3:
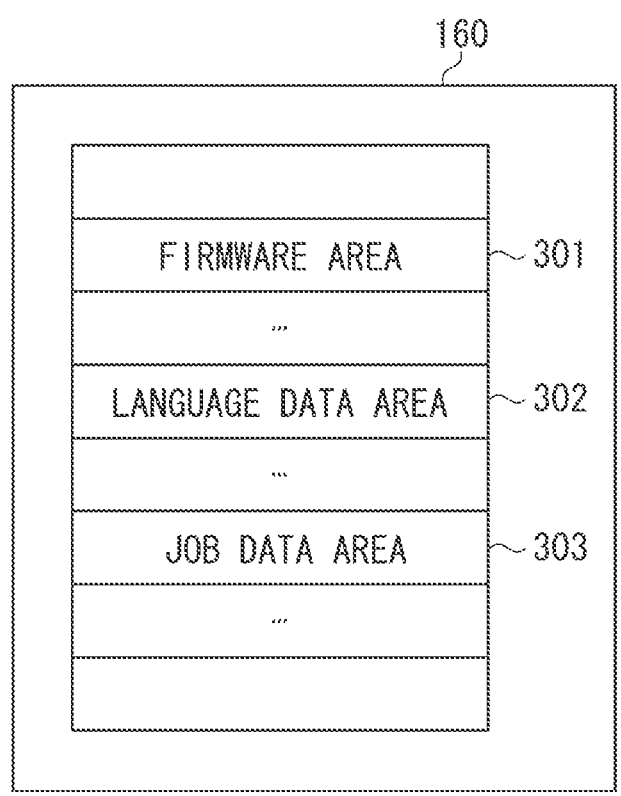
FIG. 3 is a diagram illustrating an example of a data structure of the eMMC.

FIG. 3 is a diagram illustrating an example of a data structure of the eMMC 160. A firmware area 301 is an area for storing a program executed by the CPU 13 of the controller 3. A language data area 302 is an area for storing language data on a language to be displayed by the operation unit 8. Languages other than those mainly used is to be ready in the case where the display language is switched to a lesser used language. A job data area 303 temporarily stores job data from a user and image data.

Figure 4:
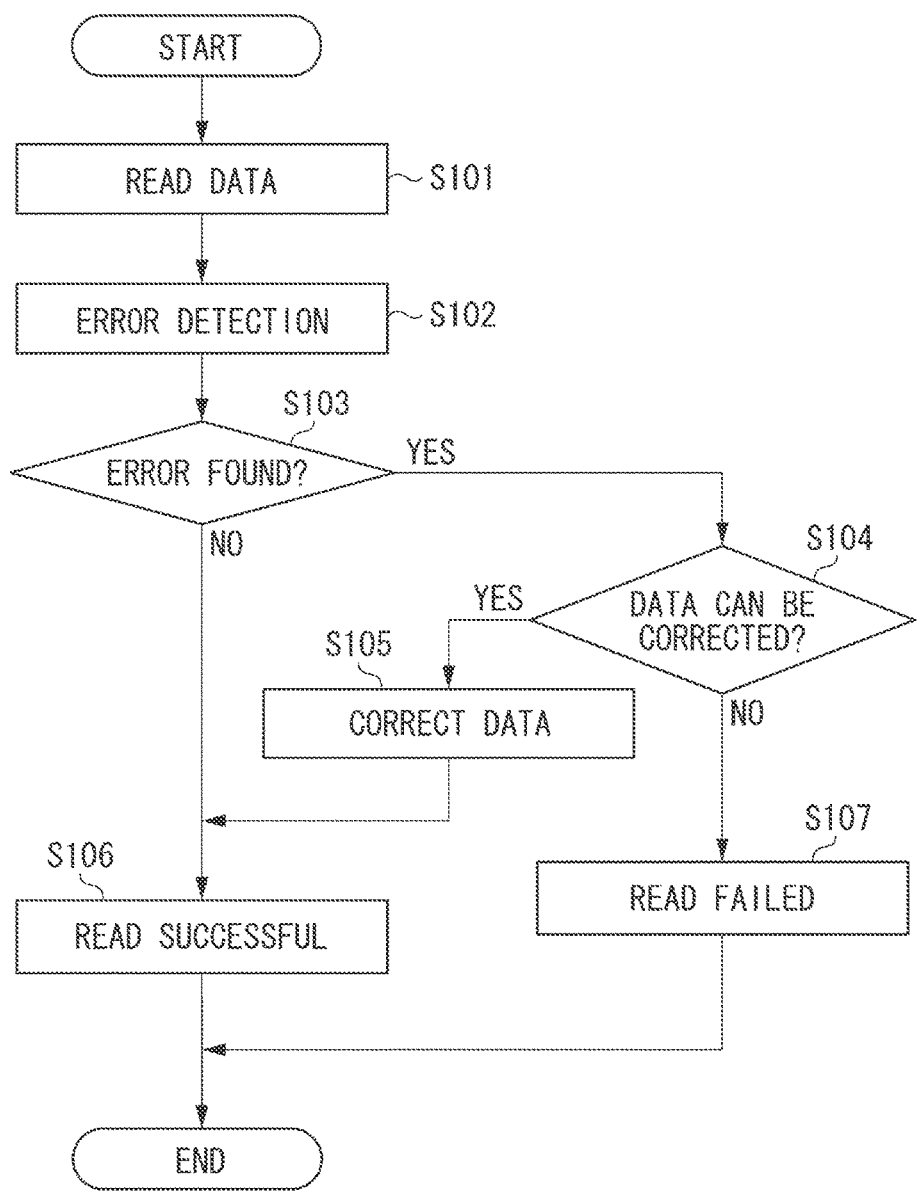
FIG. 4 is a flowchart illustrating an example of information processing for data refreshing.

FIG. 4 is a flowchart illustrating an example of information processing for data refreshing to be executed when the CPU 13 loads data from the eMMC 160 onto the memory 15.

In S101, the CPU 13 reads data stored in the eMMC 160. The data read by the CPU 13 includes a data area and a redundant area. The redundant area stores an error correction code (ECC) for detecting and correcting errors, and a flag indicating whether there is an abnormal area.

In step S102, the CPU 13 performs error detection based on data in the data area and the ECC in the redundant area read in step S101. This error correction, using ECC data and performed when reading from a NAND flash memory is performed, uses a humming code and a parity code.

In step S103, the CPU 13 determines whether a result of the processing in step S102 indicates that there is an error in the read data. When the CPU 13 determines that there is an error in the read data (YES in step S103), the processing proceeds to step S104. On the other hand, when the CPU 13 determines that there is no error in the read data (NO in step S103), the processing proceeds to step S106. In step S106, the CPU 13 determines that reading of the data is successful, and the processing in the flowchart in FIG. 4 is terminated.

In step S104, the CPU 13 determines whether the read data can be corrected based on the result of the processing in step S102. When the CPU 13 determines that the read data can be corrected (YES in step S104), the processing proceeds to step S105. On the other hand, when the CPU 13 determines that the read data cannot be corrected (NO in step S104), the processing proceeds to step S107. In step S107, the CPU 13 determines that reading of the data is failed, and the processing in the flowchart illustrated in FIG. 4 is terminated.

In step S105, the CPU 13 corrects the read data based on the data in the data area and the ECC in the redundant area read in step S101. Then, the processing proceeds to step S106. In step S106, the CPU 13 determines that reading of the data is successful, and the processing in the flowchart in FIG. 4 is terminated.

FIG. 5 is a diagram illustrating an example of an area setting table recorded in the SRAM 40.

An area setting table 500 is a set of elements for determining whether each area of the image forming apparatus 1 is set to be in the partition corresponding to the MLC mode or the partition corresponding to the SLC mode. In the example illustrated in FIG. 5, an element 501 indicates that the firmware area 301 (area ID=0) is set to be in the MLC partition. An element 502 indicates that the language data area 302 (area ID=1) is set to be in the MLC partition. An element 503 indicates that the job data area 303 (area ID=2) is set to be in the SLC partition.

A flow of processing according to the present exemplary embodiment is described with reference to flowcharts in FIG. 6 and FIG. 7.

Figure 6:
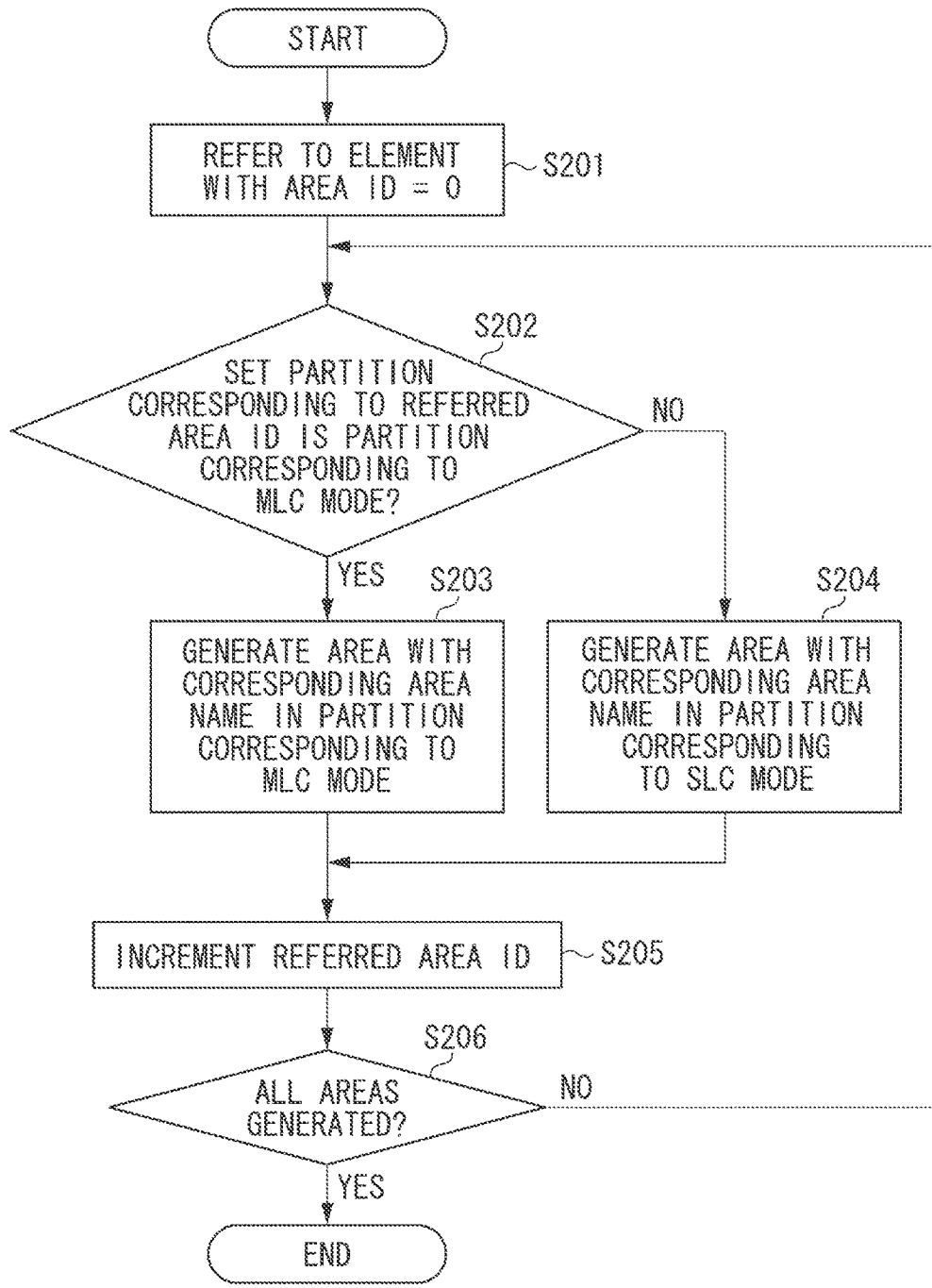
FIG. 6 is a flowchart illustrating an example of information processing according to an exemplary embodiment.

FIG. 6 is a flowchart illustrating an example of information processing for determining whether each area is set to be in the partition corresponding to the MLC mode or the partition corresponding to the SLC mode, by referring to the area setting table 500.

The eMMC 160 is assumed to be divided in advance so that the partitions corresponding to the MLC mode and the SLC mode are prepared.

In step S201, the CPU 13 acquires the area setting table 500 stored in the SRAM 40, and refers to a top element (area ID=0). Then, the processing proceeds to step S202.

In step S202, the CPU 13 checks the set partition corresponding to the referred ID, and determines whether the set partition corresponds to the MLC mode. When the CPU 13 determines that the set partition is the MLC partition (YES in step S202), the processing proceeds to step S203. On the other hand, when the CPU 13 determines that the set partition is the SLC partition (NO in step S202), the processing proceeds to step S204.

In step S203, the CPU 13 generates an area with an area name corresponding to the referred area ID in the predetermined MLC partition 201, and the processing proceeds to step S205.

In step S204, the CPU 13 generates an area with an area name corresponding to the referred area ID in the predetermined SLC partition 202, and the processing proceeds to step S205.

In step S205, the CPU 13 increments an area ID referred to in the area setting table 500, and the processing proceeds to step S206.

In step S206, the CPU 13 determines whether all the areas defined in the area setting table 500 have been generated. When the CPU 13 determines that there is no more element to be referred to after the one referred to in step S205 and that all the areas have been generated (YES in step S206), the processing in the flowchart illustrated in FIG. 6 is terminated. When the CPU 13 determines that not all the areas have been generated yet (NO in step S206), the processing returns to step S202.

FIG. 7 is a flowchart illustrating an example of information processing for periodical data refreshing executed once in every few months, for example.

In step S301, the CPU 13 increments a data refreshing execution count stored in the SRAM 40, and the processing proceeds to step S302.

In S302, the CPU 13 determines whether the data refreshing execution count has reached a predetermined count. When the CPU 13 determines that the execution count has reached the predetermined count (YES in step S302), the processing proceeds to step S303. On the other hand, when the CPU 13 determines that the execution count has not reached the predetermined count (NO in step S302), the processing proceeds to step S305.

In step S303, the CPU 13 sets a predetermined count reached flag, stored in the memory 15, to ON, and the processing proceeds to step S304.

In step S304, the CPU 13 resets the data refreshing execution count to 0, and the processing proceeds to step S305.

In step S305, the CPU 13 acquires the area setting table 500 stored in the SRAM 40, and refers to the top element (area ID=0). Then, the processing proceeds to step S306.

In step S306, the CPU 13 checks the set partition corresponding to the referred ID, and determines whether the set partition is the MLC partition. When the CPU 13 determines that the set partition is the MLC partition (YES in step S306), the processing proceeds to step S307. On the other hand, when the CPU 13 determines that the set partition is the SLC partition (NO in step S306), the processing proceeds to step S308.

In step S307, the CPU 13 performs data refreshing for the area corresponding to the referred ID. This data refreshing is the general processing described with reference to FIG. 4.

In step S308, the CPU 13 checks the predetermined count reached flag and determines whether the flag is ON. When the CPU 13 determines that the predetermined count reached flag is ON (YES in step S308), the processing proceeds to step S307. On the other hand, when the CPU 13 determines that the predetermined count reached flag is OFF (NO in step S308), the processing proceeds to step S309. For example, in one embodiment, the predetermined count is about 10 times, considering the nature of the SLC and the MLC.

In step S309, the CPU 13 increments the area ID referred to in the area setting table 500, and the processing proceeds to step S310.

In step S310, the CPU 13 determines whether all the areas defined in the area setting table 500 have been checked. When the CPU 13 determines that there is no more element to be referred to after the one referred to in step S309, and thus determines that all the areas have been checked (YES in step S310), the processing proceeds to step S311. On the other hand, when the CPU 13 determines that not all the areas have been checked (NO in step S310), the processing returns to step S306.

In step S311, the CPU 13 sets the predetermined count reached flag to OFF, and the processing in the flowchart illustrated in FIG. 7 is terminated.

As described above, in the information processing according to the present exemplary embodiment, the eMMC 160 can be used with a lower risk of losing data in a partition used in the MLC mode involving a shorter data retention period than the SLC mode. Thus, higher product reliability can be achieved in terms of data management. In the example of the present exemplary embodiment illustrated in FIG. 7, the execution frequency of the data refreshing can be set differently between the MLC partition and the SLC partition based on the execution counts. As another example, the execution frequency of the data refreshing can be set differently between the MLC partition and the SLC partition based on a period between data refreshing execution timings. For example, the CPU 13 may perform data refreshing on the MLC partition once in a predetermined period, and may perform data refreshing on the SLC partition once in every period longer than the predetermined period.

An exemplary embodiment of the disclosure is described above in detail. However, the disclosure is not limited to the certain exemplary embodiment.

With the information processing according to the exemplary embodiment described above, the data refreshing can be performed at an appropriate frequency in a nonvolatile memory that can be divided into partitions corresponding to the MLC mode and the SLC mode. More specifically, the risk of losing data in an eMMC used in the MLC mode, with a higher risk of losing data compared with the SLC mode, can be reduced and thus higher reliability can be achieved. Further, the refreshing frequency is set to be lower for the area set to be in the partition corresponding to the SLC mode than for the area set to be in the partition corresponding to the MLC mode, and thus the performance can be more effectively prevented from being compromised by the overlapping between the execution of the refreshing and the execution of a job by a user.

Other Embodiments

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-100796, filed May 19, 2016, which is hereby incorporated by reference herein in its entirety.

What is claimed is:

1. A storage control device comprising:
    a nonvolatile storage that has a plurality of areas;
        a setting unit configured to set a Multi Level Cell (MLC) mode or a Single Level Cell (SLC) mode for each of the plurality of areas; and
    a control unit configured to perform data refreshing on a predetermined area;
    wherein, in a predetermined period, number of times of data refreshing performed on an area for which the MLC mode is set is larger than number of times of data refreshing performed on an area for which the SLC mode is set.

2. The storage control device according to claim 1, wherein the nonvolatile storage is an embedded Multi Media Card (eMMC).

3. The storage control device according to claim 1, wherein the storage control device is an image forming apparatus.

4. The storage control device according to claim 1, wherein a firmware program is stored in the area for which the MLC mode is set, and job data is stored in the area for which the SLC mode is set.

5. An information processing method executed by a storage control device, the method comprising:
    setting a Multi Level Cell (MLC) mode or a Single Level Cell (SLC) mode for each of a plurality of areas; and
    performing data refreshing on a predetermined area;
    wherein, in a predetermined period, number of times of data refreshing performed on an area for which the MLC mode is set is larger than number of times of data refreshing performed on an area for which the SLC mode is set.

6. The information processing method according to claim 5, wherein the nonvolatile storage is an embedded Multi Media Card (eMMC).

7. The information processing method according to claim 5, wherein the storage control device is an image forming apparatus.

8. The information processing method according to claim 5, wherein a firmware program is stored in the area for which the MLC mode is set, and job data is stored in the area for which the SLC mode is set.

9. A non-transitory computer readable storage medium storing a computer-executable program of instructions for causing a computer to perform a method executed comprising:
    setting a Multi Level Cell (MLC) mode or a Single Level Cell (SLC) mode for each of a plurality of areas; and
    performing data refreshing on a predetermined area;
    wherein, in a predetermined period, number of times of data refreshing performed on an area for which the MLC mode is set is larger than number of times of data refreshing performed on an area for which the SLC mode is set.

10. The non-transitory computer readable storage medium according to claim 9, wherein the nonvolatile storage is an embedded Multi Media Card (eMMC).

11. The non-transitory computer readable storage medium according to claim 9, wherein a firmware program is stored in the area for which the MLC mode is set, and job data is stored in the area for which the SLC mode is set.

12. The storage control device according to claim 1, wherein the control unit performs data refreshing periodically on the area for which the MLC mode is set.

13. The storage control device according to claim 12, wherein the control unit performs data refreshing on the area for which the SLC mode is set on the basis of performing data refreshing predetermined number of times on the area for which the MLC mode is set.

14. The storage control device according to claim 1, wherein the predetermined number of times is number of times of data refreshing performed for the same area for which the MLC mode is set.

15. The information processing method according to claim 5, further comprising performing data refreshing periodically on the area for which the MLC mode is set.

16. The information processing method according to claim 15, further comprising performing data refreshing on the area for which the SLC mode is set on the basis of performing data refreshing predetermined number of times on the area for which the MLC mode is set.

17. The information processing method according to claim 5, wherein the predetermined number of times is number of times of data refreshing performed for the same area for which the MLC mode is set.

18. The non-transitory computer readable storage medium according to claim 9, further comprising performing data refreshing periodically on the area for which the MLC mode is set.

19. The non-transitory computer readable storage medium according to claim 18, further comprising performing data refreshing on the area for which the SLC mode is set on the basis of performing the data refreshing predetermined number of times on the area for which the MLC mode is set.

20. The non-transitory computer readable storage medium according to claim 9, wherein the predetermined number of times is number of times of data refreshing performed for the same area for which the MLC mode is set.

* * * * *